(12) United States Patent
Hoshino et al.

(10) Patent No.: US 6,538,310 B2
(45) Date of Patent: Mar. 25, 2003

(54) LSI PACKAGE WITH INTERNAL WIRE PATTERNS TO CONNECT AND MOUNT BARE CHIP TO SUBSTRATE

(75) Inventors: Hitoshi Hoshino, Tokyo (JP); Tomiji Sato, Tokyo (JP); Atsushi Taga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/805,118

(22) Filed: Mar. 14, 2001

(65) Prior Publication Data

US 2001/0050426 A1 Dec. 13, 2001

(30) Foreign Application Priority Data

Mar. 15, 2000 (JP) ........................................ 2000-072048

(51) Int. Cl.[7] .............................................. H01L 23/02
(52) U.S. Cl. .................... 257/678; 257/698; 257/700; 257/737; 257/778; 257/781; 29/852; 361/768
(58) Field of Search ............................. 174/52; 357/69, 357/70, 74, 75, 80; 361/768, 774, 783; 257/698, 700, 737, 778, 781; 29/852

(56) References Cited

U.S. PATENT DOCUMENTS 4,725,692 A * 2/1988 Ishii et al. ..................... 174/52
5,138,438 A * 8/1992 Masayuki et al. ............ 357/75
5,906,042 A * 5/1999 Lan et al. ...................... 29/830
6,239,983 B1 * 5/2001 Shingai et al. .............. 174/255

FOREIGN PATENT DOCUMENTS

| JP | 8-279590 | 10/1996 |
|---|---|---|
| JP | 9-148699 | 6/1997 |
| JP | 9-162320 | 6/1997 |
| JP | 11-17059 | 1/1999 |
| JP | 11-111896 | 4/1999 |
| JP | 11-233678 | 8/1999 |
| JP | 2973646 | 9/1999 |

* cited by examiner

*Primary Examiner*—David Nelms
*Assistant Examiner*—Mai-Huong Tran
(74) *Attorney, Agent, or Firm*—Sughrue Mion, PLLC

(57) ABSTRACT

The present invention is provides an LSI package without employing steps for forming solder bumps on a bare chip and soldering to an interposer. In the present invention, a bare chip is mounted on the LSI package by forming wiring patterns which connect to bare chip I/O terminals in a build-up layer of a substrate. Furthermore, the wiring patterns are formed so as to connect outer I/O terminals on the substrate.

5 Claims, 3 Drawing Sheets

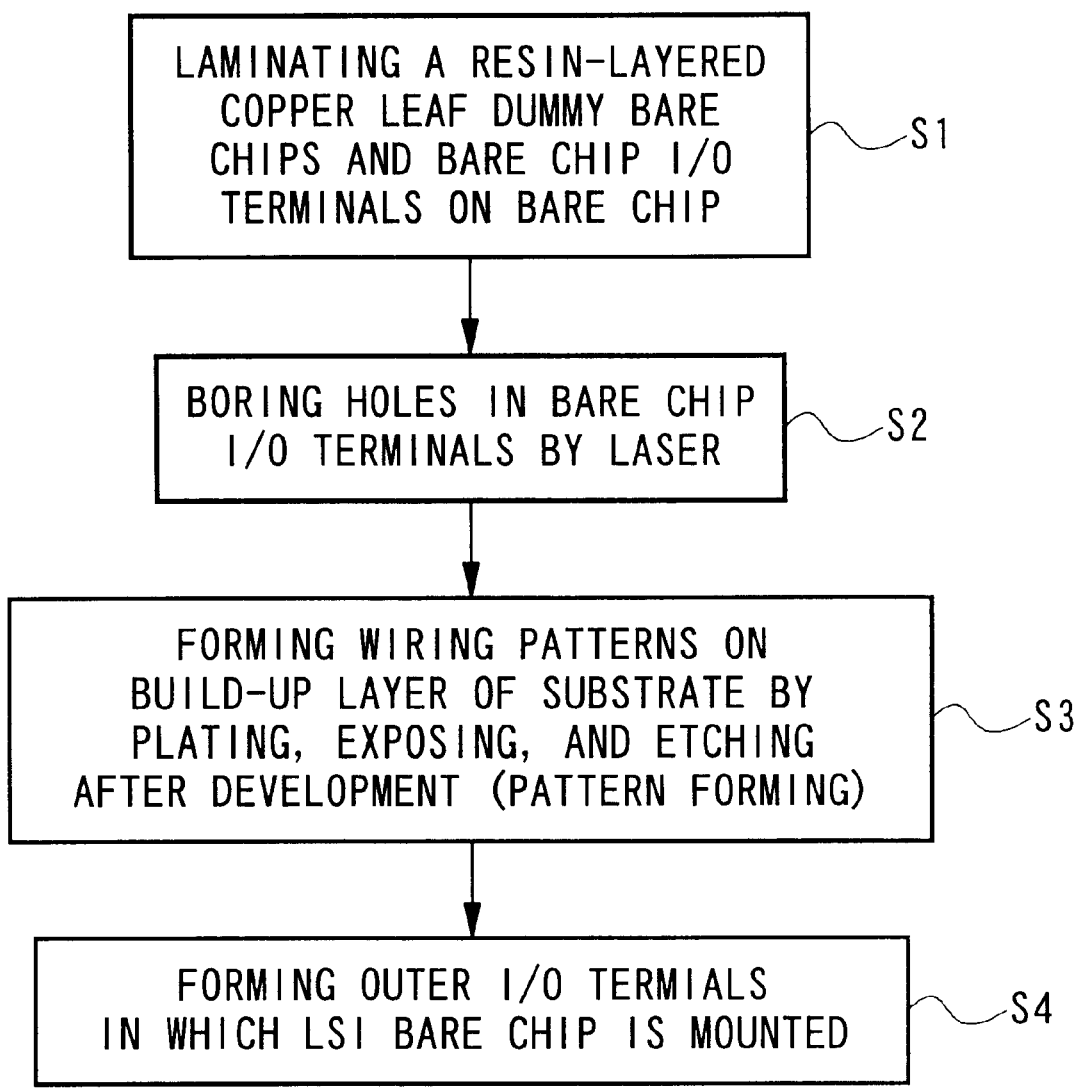

LSI PACKAGE WITH INTERNAL WIRE PATTERNS TO CONNECT AND MOUNT BARE CHIP TO SUBSTRATE

BACKGROUND OF THE INVENTION

1. Field of the Invention

The present invention relates to an LSI (Large Scale Integration) package and an internal connecting method used therefor.

2. Description of the Related Art

Currently, in the field of semiconductor packages, packages having new types of shapes have been developed one after another, in order to comply with requests such as minimizing and lightening, accelerating, and enhancing functions, for electronic apparatuses such as computers. As a result, a variety of packages presently exist.

In the typical structure of the packages, a bare chip which is provided on a die pad is connected with leads for achieving an electrical connection with outer circuits by bonding wires. Furthermore, on the die pad, the bare chip and channels which include the leads are covered by a package mold.

LSI packages having such structures are used by being mounted on printed-circuit boards of various electronic apparatuses. The LSI packages as described above are disclosed in Japanese Unexamined Patent Application, First Publication Nos. Hei 5-114776 and Hei 8-279590 and the like.

In a conventional bare chip, the bare chip is connected by providing solder bumps on the bare chip and soldering the bumps to a substrate or a film which is called an interposer. However, it is difficult to form very small solder bumps.

The object of the present invention is to solve the above problem, and to provide an LSI package without employing steps for forming solder bumps on the bare chip and soldering to the interposer, and an internal connecting method used therefor.

SUMMARY OF THE INVENTION

An LSI package of the present invention has a substrate in which a bare chip is mounted, wherein a build-up method is used for forming wiring patterns which connect input/output terminals of the bare chip and outer input/output terminals of the substrate.

Furthermore, the internal connecting method for an LSI package of the present invention is an internal connecting method for an LSI package having a substrate in which a bare chip is mounted. The method includes a step for forming wiring patterns which connect input/output terminals of the bare chip and outer input/output terminals of the substrate by a build-up method.

That is, the LSI package of the present invention is characterized by employing the wiring patterns formed by the build-up method as a means for mounting the bare chip and for the internal connecting thereof, instead of conventional bump connections.

In the present invention, since the connection between the bare chip and the interposer is accomplished by the build-up method instead of bump connections, the connection can be made without using solder between the very small solder bumps and the interposer. Consequently, it is unnecessary to employ the steps for forming the solder bumps on the bare chip and soldering to the interposer.

BRIEF EXPLANATION OF THE DRAWINGS

FIG. 4 is a flow chart for explaining the internal connecting method according to an embodiment of the present invention.

DESCRIPTION OF THE PREFERRED EMBODIMENTS

Figure 1:
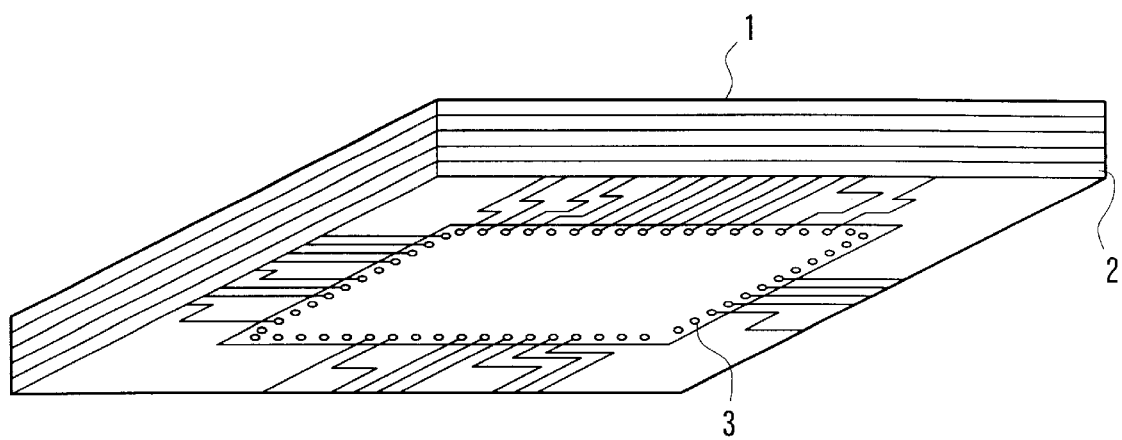
FIG. 1 is a perspective view for explaining the connection by the build-up method according to an embodiment of the present invention.
Figure 2:
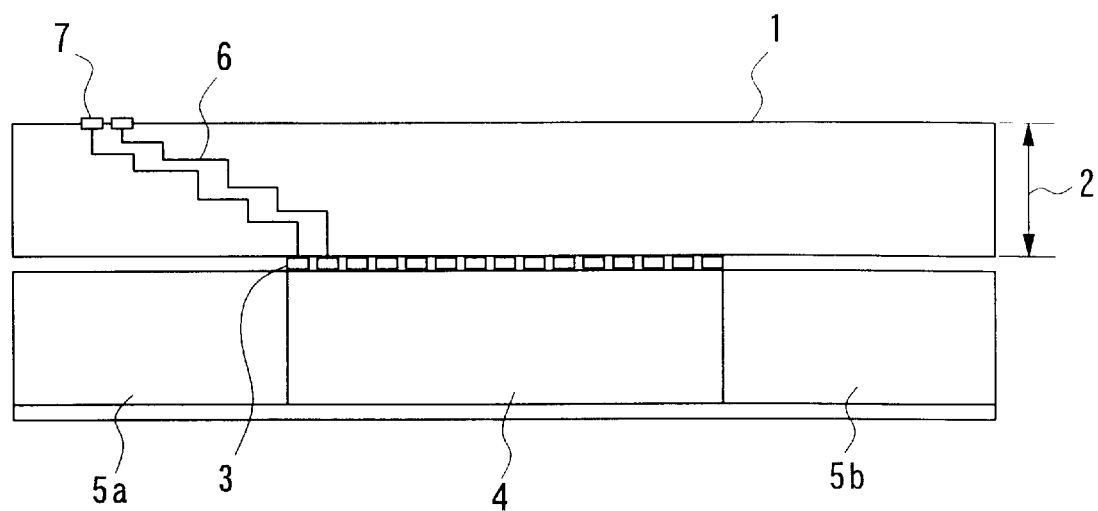
FIG. 2 is a cross-sectional view of an LSI package according to an embodiment of the present invention.
Figure 3:
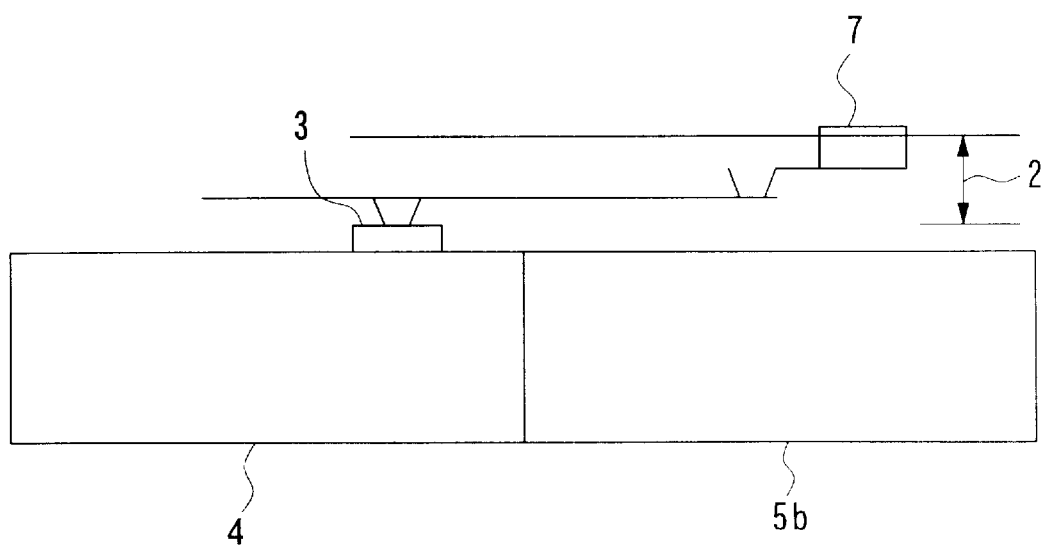
FIG. 3 is an illustration for explaining the connection of a bare chip according to an embodiment of the present invention.

The preferred embodiments will be presented in the following with reference to the figures. FIG. 1 is a perspective view for explaining the connection by the build-up method according to an embodiment of the present invention, FIG. 2 is a cross-sectional view of an LSI package according to an embodiment of the present invention, and FIG. 3 is an illustration for explaining the connection of a bare chip according to an embodiment of the present invention. The connection of the bare chip concerning the embodiment of the present invention will be explained with reference to FIGS. 1 to 3.

A plurality of bare chip I/O (input/output) terminals 3 are provided on a bare chip 4, and the bare chip 4 is mounted on the LSI package by forming wiring patterns 6 which connect the bare chip I/O terminals 3 in a build-up layer 2 of a substrate 1. Furthermore, the wiring patterns 6 are formed so as to connect outer I/O terminals 7 on the substrate 1.

FIG. 4 is a flow chart for explaining the internal connecting method according to the embodiment of the present invention. The internal connecting method of the LSI package concerning the embodiment of the present invention will be explained with reference to FIGS. 1 to 4.

In the connecting method of this embodiment, first, a resin-layered copper leaf is laminated on dummy bare chips 5a and 5b and on the bare chip I/O terminals 3 on the bare chip 4 (step S1 in FIG. 4), and next, holes are bored in the bare chip I/O terminals 3 by laser (step S2 in FIG. 4).

After that, the wiring patterns 6 are formed on the build-up layer 2 of the substrate 1 by plating, exposing, and etching after development (pattern forming) (step S3 in FIG. 4); and the outer I/O terminals 7 are formed so as to connect the wiring patterns 6 on the substrate 1 in which the bare chip 4 is mounted (step S4 in FIG. 4).

As described above, in the present invention, since the wiring patterns 6 for connection between the bare chip I/O terminals 3 and the outer I/O terminals 7 are formed in the build-up layer 2 by the build-up method, connection of the bare chip 4 can be made without using solder between the very small solder bumps and the interposer. Consequently, according to the present invention, it is unnecessary to employ the steps for forming the solder bumps on the bare chip 4 and soldering to the interposer when producing the LSI package which comprises the substrate in which the bare chip is mounted.

What is claimed is:

1. An LSI package having a substrate in which a bare chip is mounted, wherein a build-up method is used for forming wiring patterns which connect input/output terminals of said bare chip and outer input/output terminals of said substrate.

2. An LSI package according to claim 1, wherein said wiring patterns are formed in a build-up layer of said substrate for connecting said input/output terminals which are provided on the substrate-side surface of said bare chip and said outer input/output terminals which are provided on the surface of said substrate facing said bare chip.

3. An LSI package according to claim 1, wherein said wiring patterns are formed in a build-up layer of said substrate for connecting said input/output terminals which are provided on the substrate-side surface of said bare chip and on dummy bare chips which are formed adjacent to said bare chip, and said outer input/output terminals which are provided on the surface of said substrate facing said bare chip.

4. An LSI package according to claim 1, wherein the bare chip is mounted without using solder.

5. An LSI package according to claim 1, wherein the wiring patterns formed by the build-up method mount the bare chip.

* * * * *